(12) United States Patent
Sumiyoshi

(10) Patent No.: US 6,256,086 B1
(45) Date of Patent: Jul. 3, 2001

(54) PROJECTION EXPOSURE APPARATUS, AND DEVICE MANUFACTURING METHOD

(75) Inventor: Yuhei Sumiyoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/411,392

(22) Filed: Oct. 4, 1999

(30) Foreign Application Priority Data

Oct. 6, 1998 (JP) .................................................. 10-299139

(51) Int. Cl.⁷ .......................... G03B 27/52; G03B 27/42; G03B 27/54
(52) U.S. Cl. .................................. 355/55; 355/53; 355/67
(58) Field of Search ................................. 355/55, 67, 52, 355/68, 69, 53, 71, 77; 359/432, 821; 372/20; 382/144; 353/69; 438/7, 16

(56) References Cited

U.S. PATENT DOCUMENTS

| | | | | |
|---|---|---|---|---|
| 4,425,648 | * | 1/1984 | Holly | 372/20 |
| 4,811,055 | | 3/1989 | Hirose | 355/53 |
| 4,922,290 | * | 5/1990 | Yoshitake et al. | 355/53 |
| 5,105,075 | | 4/1992 | Ohta et al. | 250/201.2 |
| 5,117,255 | * | 5/1992 | Shiraishi et al. | 355/53 |
| 5,424,803 | | 6/1995 | Noguchi | 355/53 |
| 5,436,692 | * | 7/1995 | Noguchi | 355/53 |
| 5,627,627 | * | 5/1997 | Suzuki | 355/68 |
| 5,661,546 | * | 8/1997 | Taniguchi | 355/53 |
| 5,831,715 | * | 11/1998 | Takahashi | 355/53 |
| 5,912,727 | * | 6/1999 | Kawai | 355/67 |
| 5,914,773 | * | 6/1999 | Kurosawa et al. | 355/53 |
| 5,953,106 | * | 9/1999 | Unno et al. | 355/55 |
| 6,011,611 | * | 1/2000 | Nomura et al. | 355/67 |
| 6,014,455 | * | 1/2000 | Sumiyoshi et al. | 382/144 |
| 6,028,659 | * | 2/2000 | Kaneko | 355/53 |

FOREIGN PATENT DOCUMENTS

| | | |
|---|---|---|
| 0 742 492 | 11/1996 | (EP) . |
| 60-214334 | 10/1985 | (JP) . |
| 2-81019 | 3/1990 | (JP) . |
| 4-30411 | 2/1992 | (JP) . |
| 8-255748 | 10/1996 | (JP) . |

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus having a function for adjusting a projection magnification, a symmetric distortion aberration and another optical characteristic of a projection optical system is disclosed, wherein, when the projection magnification and the symmetric distortion aberration are adjusted, the other optical characteristic of the projection optical system is adjusted so that a change thereof is reduced very small or zero, such that good optical performance of the projection optical system is retained.

11 Claims, 6 Drawing Sheets

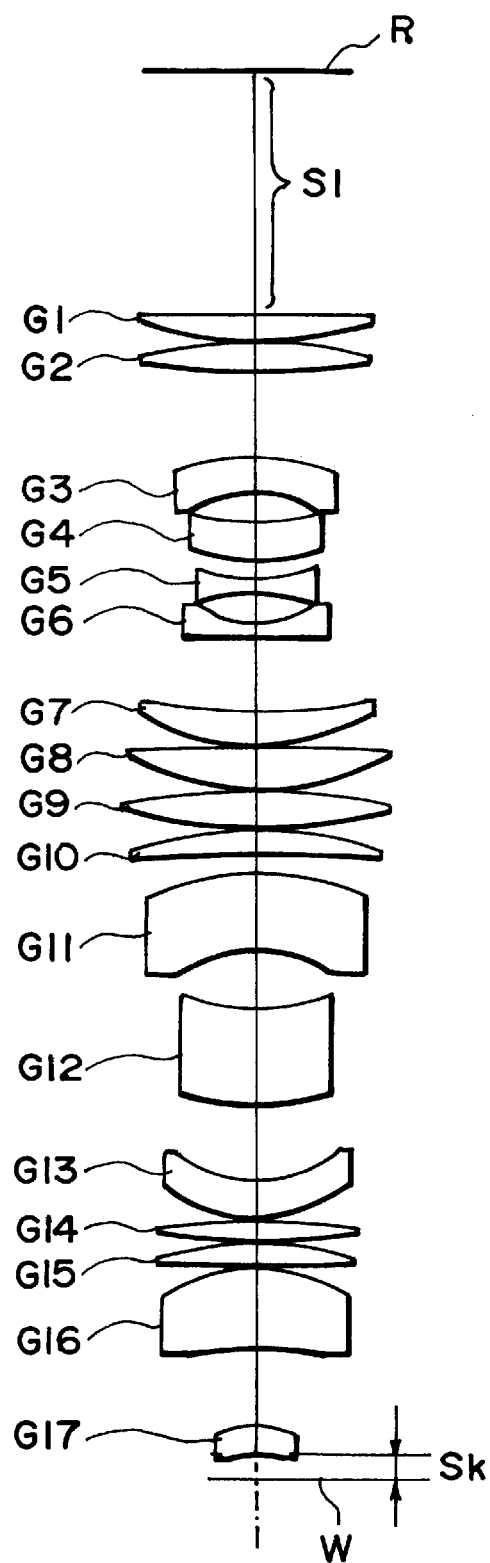
F I G. 2

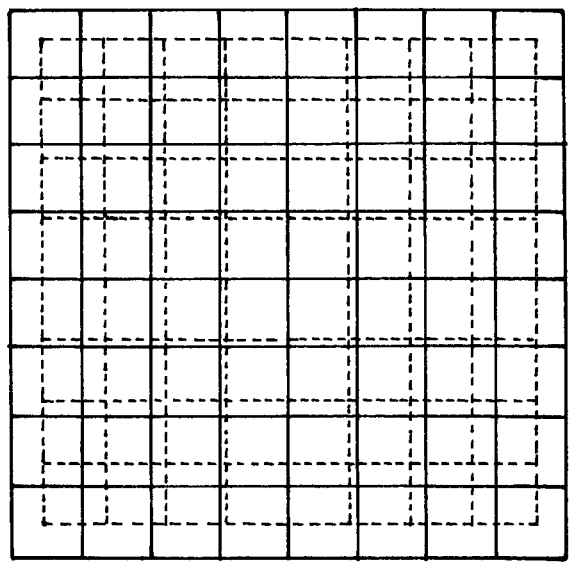
F I G. 5
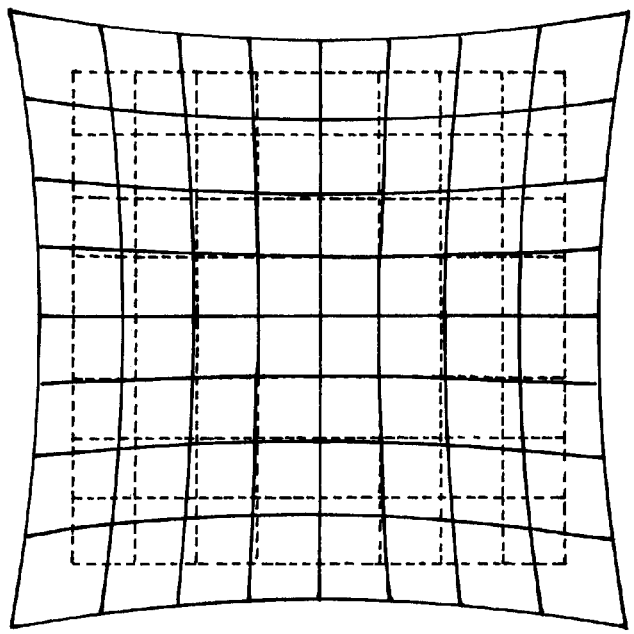
F I G. 6

PROJECTION EXPOSURE APPARATUS, AND DEVICE MANUFACTURING METHOD

FIELD OF THE INVENTION AND RELATED ART

This invention relates to a projection exposure apparatus and a device manufacturing method using the same. More particularly, the invention is suitable usable in a step-and-repeat type or step-and scan type stepper which is a microdevice manufacturing apparatus, for satisfactorily correcting a projection magnification error in projecting an electronic circuit pattern of a reticle onto a wafer surface or various aberrations such distortion, spherical aberration, coma or astigmatism, for example, to thereby produce a high precision projection pattern and accomplish production of a high integration device.

In printing apparatuses (aligners) for the manufacture of semiconductor devices such as IC or LSI, a very high assembling precision and a very high optical performance are required.

As regards the optical performance, a matching precision in the registration of a reticle having an electronic circuit pattern with a wafer is particularly important. The size of a pattern used in a reticle is becoming smaller and smaller, and thus the required matching precision becomes higher and higher. As the factors which are most influential to the matching precision, there are a projection magnification error and a distortion error of a projection optical system.

The projection magnification error is a deviation of the projection magnification (lateral magnification) of a projection optical system from a reference value. The distortion error is a deviation of distortion aberration (distortion) of a projection optical system from a reference value. Both of the projection magnification error and the distortion error appear as a difference between a grid point of a projected pattern and a reference grid point desired.

If a projection optical system has a projection magnification error, there appears an error such as shown in FIG. 5 wherein, while the shape of an idealistic grid is unchanged and kept analogous, the size thereof is changed.

If a projection optical system has a symmetric distortion aberration, there appears an error such as shown in FIGS. 6 and 7 wherein the idealistic grid is deformed into a spindle-like shape or a cask-like shape. If this aberration changes to produce a distortion error, the state of deformation also changes.

Generally, the projection magnification error and the distortion error of a projection optical system are corrected by the adjustment of the projection optical system in its manufacturing process or the adjustment of the projection optical system during the setting operation of an exposure apparatus wherein the projection optical system is incorporated. However, they may be changed after the setting, due to the surrounding environment thereof, particularly, the pressure or temperature. Also, a projection optical system absorbs exposure energies during exposure of a wafer and, due to an increase of the temperature of the system, optical parameters such as a refractive index or a shape, for example, may change. This may cause a projection magnification error and a distortion error, and the magnitude of such error may change thereby.

Correction of a projection magnification error and a distortion error in a stepper has been proposed in some documents such as follows.

Japanese Laid-Open Patent Application, Laid-Open No. 81019/1990 shows a projection exposure apparatus wherein the spacing between a reticle (object plane) and a projection optical system as well as the spacing between lenses of the projection optical system are changed to thereby correct a projection magnification error and a distortion error.

Japanese Laid-Open Patent Application, Laid-Open No. 214334/1985 shows an exposure apparatus wherein, based on a remaining chromatic aberration of magnification in a projection optical system, the wavelength of exposure light is changed to adjust a projection magnification.

Japanese Laid-Open Patent Application, Laid-Open No. 30411/1992 shows an exposure apparatus wherein at least one lens group of a projection optical system is moved in an optical axis direction and, also, the wavelength of exposure light is changed, by which a projection magnification error and a symmetrical distortion error are corrected.

Japanese Laid-Open Patent Application, Laid-Open No. 255748/1996 shows an exposure apparatus wherein two or more particular groups of optical elements in a projection optical system are moved in an optical axis direction, by which a projection magnification error and a distortion error are corrected.

U.S. Pat. No. 5,117,255 shows an exposure apparatus wherein a recticle or at least one lens of a projection optical system is moved three-dimensionally, by which a distortion aberration is corrected.

As the projection magnification error or the distortion aberration is corrected, aberrations of a projection optical system are changed thereby. Among these aberrations being changed, the one which has a smallest tolerance and may cause a problem is a coma aberration. If a coma aberration larger than a tolerance is left in the projection optical system, there may occur a phenomenon of a lateral shift of a circuit pattern being projected. Additionally, it may cause "frequency dependency of distortion" in which the quantity of lateral shift depends on the pattern size or the pattern direction. Since it is a lateral shift amount, it directly influences the final registration (total overlay) of plural mask patterns. Thus, it must be controlled precisely.

SUMMARY OF THE INVENTION

It is an object of the present invention to provide a projection exposure apparatus and/or a device manufacturing method using the same, by which a high optical performance can be accomplished.

In accordance with an aspect of the present invention, there is provided a projection exposure apparatus having a function for adjusting a projection magnification, a symmetric distortion aberration and another optical characteristic of a projection optical system, said apparatus comprising: first changing means for changing a first optical parameter of said projection optical system; second changing means for changing a second optical parameter of said projection optical system; and third changing means for changing a third optical parameter of said projection optical system; wherein a change in the projection magnification, a change in the symmetric distortion aberration and a change in the optical characteristic, all to be produced when the first optical parameter is changed, are $\Delta\beta_1$, $\Delta SD_1$ and $\Delta A_1$, respectively; wherein a change in the projection magnification, a change in the symmetric distortion aberration and a change in the optical characteristic, all to be produced when the second optical parameter is changed, are $\Delta\beta_2$, $\Delta SD_2$ and $\Delta A_2$, respectively; wherein a change in the projection magnification, a change in the symmetric distortion aberration and a change in the optical characteristic, all to be produced when the third optical parameter is changed, are $\Delta\beta_3$, $\Delta SD_3$ and $\Delta A_3$, respectively; wherein angles each defined by two of three vectors ($\Delta\beta_1$, $\Delta SD_1$, $\Delta A_1$), ($\Delta\beta_2$, $\Delta SD_2$, $\Delta A_2$) and ($\Delta\beta_3$, $\Delta SD_3$, $\Delta A_3$) are not less than 30 deg. and not greater than 150 deg.; and wherein the quantities of all the aforementioned changes correspond to those values each being provided by standardising an amount of actual change with respect to a an amount of largest change to be produced due to corresponding one of said first to third changing means.

In one preferred form of the present invention, the first changing means may change a position of a first optical element, such as a lens, of said projection optical system in a direction of an optical axis, the second changing means may change a position of a second optical element, such as a lens, of said projection optical system in a direction of an optical axis, and the third changing means may change a wavelength of exposure light, such as excimer laser light, to be incident on said projection optical system.

In one preferred form of the present invention, the other optical characteristic of the projection optical system may be a coma aberration, for example.

In accordance with another aspect of the present invention, there is provided a device manufacturing method, comprising the steps of: printing a device pattern of a reticle on a wafer by projection exposure with use of a projection exposure apparatus such as described above, and developing the exposed wafer.

In one preferred form of the present invention, the projection optical system may have optical elements constituted only by dioptric elements such as lenses, or the projection optical system may have optical elements constituted by a dioptric element such as a lens and a catoptric element such as a mirror.

The wavelength of exposure light incident on the projection optical system may be one of 365 nm, 248 nm, 193 nm, and 157 nm.

The wavelength of exposure light may be changed to a desired value in accordance with a change in shape of an effective light source of an illumination optical system.

The projection magnification and the symmetric distortion aberration may be changed to desired values, respectively, in accordance with a change in shape of the effective light source of the illumination optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a sectional view of a projection optical system of FIG. 1.

FIG. 5 is a schematic view for explaining a projected pattern, resulting from a projection optical system with a projection magnification error.

FIG. 6 is a schematic view for explaining a projected pattern, resulting from a projection optical system with a symmetric distortion aberration.

DESCRIPTION OF THE PREFERRED EMBODIMENTS

Figure 1:
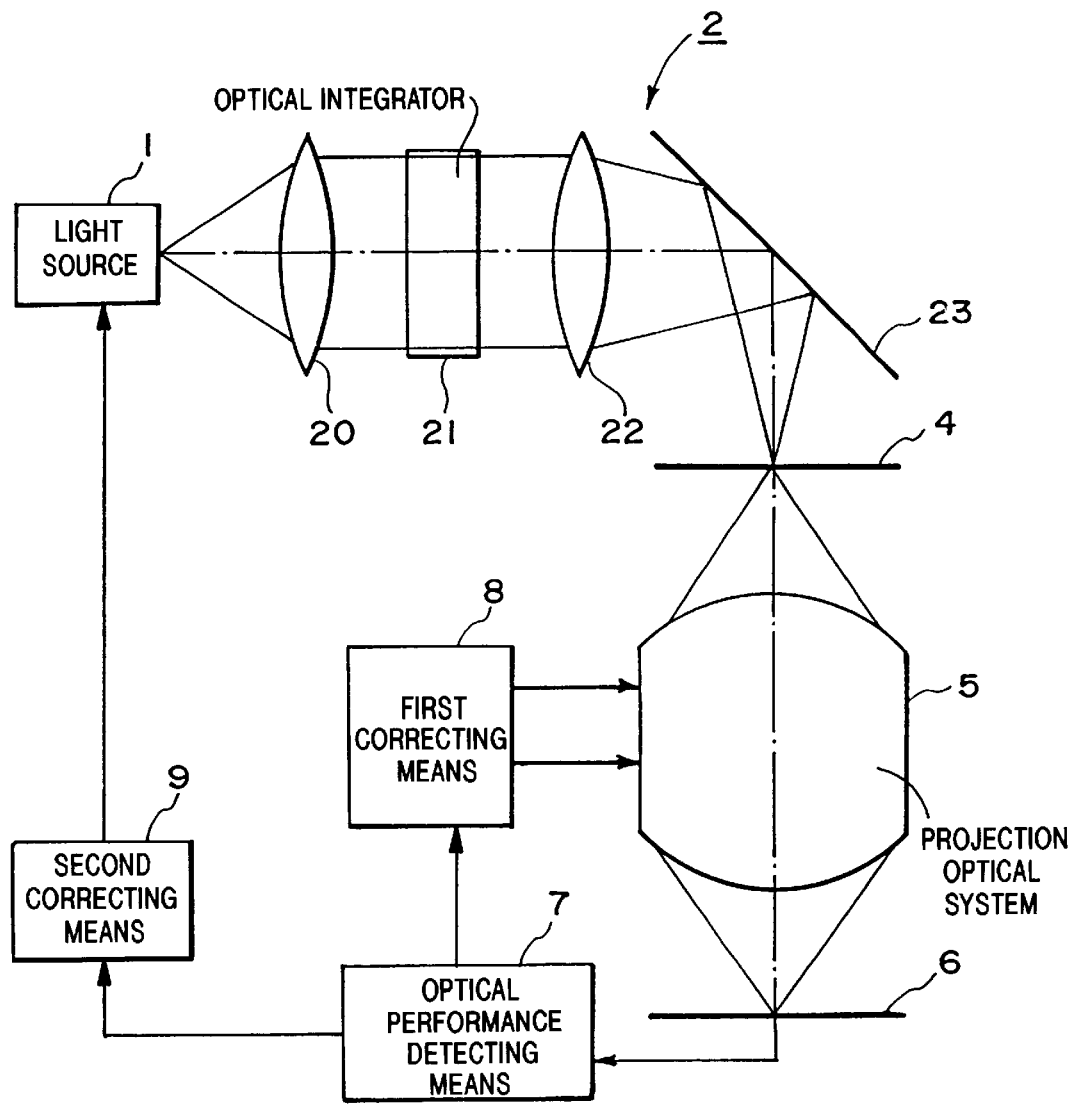
FIG. 1 is a schematic view of a main portion of a projection exposure apparatus according to a first embodiment of the present invention.

FIG. 1 is a schematic view of a main portion of a projection exposure apparatus according to a first embodiment of the present invention.

Denoted in the drawing at 1 is an exposure light source which comprises an injection-locked excimer laser, for example. Alternatively, the light source may comprise an excimer laser not injection-locked but having a resonator and a spectral element disposed in the laser for the band-narrowing. Denoted at 2 is an illumination optical system which comprises a collimator lens 20, an optical integrator 21, a condenser lens 22, and a deflecting mirror 23, for example. The illumination optical system 2 serves to illuminate the surface of a reticle 4 uniformly, by which a uniform illuminance distribution of light is provided upon the surface of a wafer 6. The reticle 4 has formed thereon a fine electronic circuit pattern such as an IC or LSI pattern, for example. A projection optical system 5 operates to project the electronic circuit pattern of the reticle 4 onto the wafer 6 surface at a predetermined reduction magnification.

Denoted at 7 is optical characteristic detecting means which comprises photoelectric converting means having a two-dimensional image pickup means (not shown), for example, to be disposed at the position of the wafer 6 in place of the same. In the detecting operation, the circuit pattern of the reticle 4 or a grid pattern for grid inspection is projected upon the image pickup device. On the basis of imagewise data thus supplied by the image pickup device, the imaging state of the pattern image of the reticle is monitored, by which the projection magnification (error), spherical aberration, coma aberration, astigmatism, and distortion aberration (error) of the projection optical system 5 can be detected photoelectrically.

Denoted at 8 is first correcting means. It operates on the basis of an output signal from the detecting means 7, to move predetermined lens groups (e.g., two lens groups), of the lens groups constituting the projection optical system 5, along an optical axis toward respective desired positions. Each lens group comprises one or more lenses.

Denoted at 9 is second correcting means. It operates on the basis of an output signal from the detecting means 7 to change the emission wavelength of the light source 1.

In this embodiment, the light source 1 may comprise a KrF excimer laser, an ArF excimer laser or an $F_2$ excimer laser, for example, having a spectral element, as described, such as a prism, an etalon or a grating, for example. The spectral element may be actuated to change its posture, by which the emission wavelength of the light source 1 can be changed. The wavelength of exposure light can be thus changed.

In this embodiment, appropriate two lens groups of the lens groups of the projection optical system may be moved along the optical axis to adjust their positions on the optical axis and, additionally, the emission wavelength of the light source 1 may be changed to adjust the value thereof. On the basis of these adjustments, the projection magnification and the distortion aberration of the projection optical system as well as other aberrations can be adjusted. Through this adjustment operation, the projection magnification error and the distortion error of the projection optical system can be corrected satisfactorily, without causing a substantive problem in connection with other aberrations.

The first correcting means 8 of this embodiment comprises lens driving means. As for such lens driving means, a movable barrel for holding lens groups may be guided by an air bearing guide, and the barrel may be moved in an optical axis direction by air pressure from a driving pressure source. Alternatively, a suitable voltage may be applied to a piezoelectric device to move a movable lens barrel.

In this embodiment, the pattern image formed upon the image pickup device may be image-processed by the detecting means 7, and an analysis of the pattern image may be performed thereby. On the basis of the result of the analysis, a signal corresponding to the driving amount for the lens groups may be supplied to the first correcting means 8. Additionally or alternatively, a signal for changing the emission wavelength may be applied to the correcting means 9. A further alternative method may be that the surrounding temperature, pressure and humidity, for example, of the projection optical system is detected by using respective sensors. On the basis of the detected changes, the lens groups may be actuated by the correcting means 8, or the wavelength may be changed by the wavelength changing means 9.

Next, the adjustment of the projection magnification, distortion aberration and other aberrations of the projection optical system in this embodiment, will be described more specifically.

In this embodiment, the adjustment comprises "moving a first lens group in an optical axis direction", "moving a second lens group in the optical axis direction", and "changing the exposure wavelength". Thus, at least three factors are changed. The adjustment can be done in two ways.

The first method is that, upon correction of the projection magnification error and the distortion aberration, at least one of the other aberrations (particularly, coma distortion change) is reduced to zero.

The second method is that, upon correction of the projection magnification error and the distortion error, at least two of the other aberrations (particularly, coma distortion change and image field curvature change) are reduced to a minimum.

A projection exposure apparatus according to this embodiment of the present invention may have two operation modes for performing these two ways of adjustment, selectively, in accordance with the selection by an operator.

In this embodiment, as described, the projection magnification error and the distortion error are corrected and, additionally, a change in another aberration or aberrations is positively corrected or reduced to a minimum.

In place of driving two lens groups, a similar adjustment may be done by changing the refractive index of a gas between lens elements, such as by changing the pressure or temperature thereof.

The first and second methods of adjustment described above will now be explained in greater detail.

Here, it is assumed that, when a certain optical unit $G_i$ of a projection optical system is moved in an optical axis direction by a certain driving amount (length) $S_i$, it produces:

a change in projection magnification: $\Delta \beta_i$ ... (2-4)

a change in distortion aberration: $\Delta SD_i$ ... (2-2)

a change in spherical aberration: $\Delta SA_i$ ... (2-3)

a change in coma aberration: $\Delta CM_1$ ... (2-4)

a change in image field curvature: $\Delta FC_i$ ... (2-5)

Also, it is assumed that, when the wavelength (emission wavelength) of the exposure light is changed by a small amount W, it produces:

a change in projection magnification: $\Delta \beta_w$ ... (3-1)

a change in distortion aberration: $\Delta SD_w$ ... (3-2)

a change in spherical aberration: $\Delta SA_w$ ... (3-3)

a change in coma aberration: $\Delta CM_w$ ... (3-4)

a change in image field curvature: $\Delta FC_w$ ... (3-5)

When two groups of optical units $G_1$ and $G_2$ are moved in the optical axis direction by distances $S_1$ and $S_2$, respectively, and, additionally, the wavelength is changed by W, the quantities of changes of these aberrations, when expressed without subscripts, satisfy the following relations:

$\Delta \beta = \Delta \beta_1 . S_1 + \Delta \beta_2 . S_2 + \Delta \beta_w . W$ ... (4-1)

$\Delta SD = \Delta SD_1 . S_1 + \Delta SD_2 . S_2 + \Delta SD_w . W$ ... (4-2)

$\Delta SA = \Delta SA_1 . S_1 + \Delta SA_2 . S_2 + \Delta SA_w . W$ ... (4-3)

$\Delta CM = \Delta CM_1 . S_1 + \Delta CM_2 . S_2 + \Delta CM_w . W$ ... (4-4)

$\Delta FC = \Delta FC_1 . S_1 + \Delta FC_2 . S_2 + \Delta FC_w . W$ ... (4-5)

FIRST METHOD OF ADJUSTMENT

Upon correction of the projection magnification error and the distortion error, the quantity of one of the other aberrations such as coma aberration, for example, is reduced to zero (or to any arbitrary small value). The procedure is essentially the same with the case of the spherical aberration or the curvature of image field.

As the two units move by distances $S_1$ and $S_2$, respectively, and the wavelength is shifted by W, the quantities of changes of $\beta$, SD and CM can be expressed by linear equations (4-1), (4-2) and (4-4), respectively.

$\Delta \beta = \Delta \beta_1 . S_1 + \Delta \beta_2 . S_2 + \Delta \beta_w . W$ ... (4-1)

$\Delta SD = \Delta SD_1 . S_1 + \Delta SD_2 . S_2 + \Delta SD_w . W$ ... (4-2)

$\Delta CM + \Delta CM_1 . S_1 + \Delta CM_2 . S_2 + \Delta CM_w . W$ ... (4-4)

By solving these equations, the driving amounts $S_1$ and $S_2$ as well as the wavelength shift amount W can be determined. Since there are three equations with respect to three variables ($S_1$, $S_2$ and W), the solution is a definite one. Namely, the driving amounts $S_1$ and $S_2$ as well as the wavelength shift amount W for performing the corrections by desired correcting amounts $\Delta \beta$, $\Delta SD$ and $\Delta CM$ are determined. Also, the quantities of changes of the other aberrations (in this example, the spherical aberration and the image field curvature) can be given by substituting $S_1$, $S_2$ and W into equations (4-3) and (4-5).

Namely, in addition to $\beta$ and SD, another parameter (coma aberration, in this example) can be adjusted to a suitable value.

The change in focus position of the projection optical system caused by changing the parameters can be compensated for by moving a Z stage, carrying and holding the wafer, in the optical axis direction. To this end, data for focus position changes with a variation in respective parameters may be stored in the exposure apparatus in the form of a table, and the stage may be moved by an amount of a focus position change as can be calculated in accordance with the table. Alternatively, the focus position of the projection optical system may be measured just after the parameter change, by using a TTL autofocus measuring system incorporated into the exposure apparatus, and the Z stage may be moved in accordance with the result of measurement to move and place the wafer to and at the focus position.

The first method of adjustment described above provides a significant advantage when used as follows.

First, a change in coma aberration produced as a result of adjustment of the projection magnification error and of the distortion aberration is corrected completely to zero. As described hereinbefore, the tolerance for the coma aberration is becoming very strict, and this is very advantageous. In this case, the above-described equations may be solved while taking $\Delta CM{+}0$.

Another example is that the method is used for adjustment of coma aberration when the illumination mode of a projection optical system is changed, among an ordinary or standard illumination, ring-like illumination and quadrupole illumination, for example.

It is known that, when the illumination mode is changed, it produces a change in the projection magnification error and the distortion error. It has been found that the major cause therefor is the coma aberration remaining in the projection optical system. Further, it has been found that, as the illumination mode is changed, it produces a change in an asymmetric error (i.e., coma characteristic) of a resist pattern after being developed. This is also because of the remaining coma aberration.

Further, it has been found that a coma aberration remaining in a projection optical system is a cause for the "frequency dependency of distortion" that the projection magnification (error) and the distortion aberration (error) are variable with the size of an electronic circuit pattern of a reticle. For these reasons, the coma aberration should be suppressed strictly so that it does not remain in the projection optical system.

Even when there is a residual coma aberration in a projection optical system, if adjustment of the coma aberration is attainable, an optimum coma aberration amount can be selected in accordance with an illumination mode selected. Therefore, the projection magnification error, a change in distortion aberration (distortion error) and a change in coma characteristic as the illumination mode is changed, can be adjusted to a minimum.

When the method of the present invention is to be applied to the coma aberration adjustment described above, the aforementioned equations may be solved while taking $\Delta CM$ as a desired value (including zero, of course) and $\Delta \beta = \Delta SD = 0$. Further, when the projection magnification and the distortion aberration are to be adjusted simultaneously with the coma aberration adjustment, the equations may be solved while substituting desired correction amounts into $\Delta \beta$ and $\Delta SD$.

When the present invention is to be applied to coma aberration adjustment for an illumination mode selected, data for optimum coma aberration amounts corresponding to respective illumination modes may be memorized in an exposure apparatus in the form of a table, and, when the illumination mode is changed, appropriate optical components may be changed in accordance with the information in the stored table.

Alternatively, an aerial image of a reticle device pattern or a test pattern may be observed or measured in response to the illumination made change, or a device pattern actually printed on a wafer may be measured. In place of the above, a developed pattern (resist pattern) based on such a test pattern may be measured. On the basis of such a observation or measurement, a coma aberration may be measured, and it may be corrected in accordance with the produced information to measurement.

SECOND METHOD OF ADJUSTMENT

Upon correction of the projection magnification error and the distortion aberration, the quantities of changes in two or more of the other aberrations (in this example, coma aberration change and image field curvature change) are reduced to a minimum. Essentially the same procedure will apply to any other combination of two or more aberrations.

From equations (4-1) and (4-2), the driving amounts $S_1$ and $S_2$ can be expressed by using the wavelength shift amount W. Namely, $$S_1 = A_1 \cdot W + B_1 \quad \ldots (5\text{-}1)$$

$$S_2 = A_2 \cdot W + B_2 \quad \ldots (5\text{-}2)$$

where $$A_1 = (\Delta\beta_2 \cdot \Delta SD_w - \Delta\beta_w \cdot \Delta SD_2)/(\Delta\beta_1 \cdot \Delta SD_2 - \Delta\beta_2 \cdot \Delta SD_1)$$

$$A_2 = (\Delta\beta_1 \cdot \Delta SD_w - \Delta\beta_w \cdot \Delta SD_1)/(\Delta\beta_2 \cdot \Delta SD_1 - \Delta\beta_1 \cdot \Delta SD_2)$$

$$B_1 = (\Delta\beta \cdot \Delta SD_2 - \Delta\beta_2 \cdot \Delta SD)/(\Delta\beta_1 \cdot \Delta SD_2 - \Delta\beta_2 \cdot \Delta SD_1)$$

$$B_2 = (\Delta\beta \cdot \Delta SD_1 - \Delta\beta_1 \cdot \Delta SD)/(\Delta\beta_2 \cdot \Delta SD_1 - \Delta\beta_1 \cdot \Delta SD_2)$$

By substituting these equations into equations (4-4) and (4-5), then $\Delta CM$ and $\Delta FC$ can be expressed as a linear functions of W. Namely, $$\Delta CM \times C_1 \cdot W + D_1 \quad \ldots (6\text{-}1)$$

$$\Delta FC \times C_2 \cdot W + D_2 \quad \ldots (6\text{-}2)$$

where $$C_1 = A_1 \cdot \Delta CM_1 + A_2 \cdot \Delta CM_2 + \Delta CM_w$$

$$C_2 = A_1 \cdot \Delta FC_1 + A_2 \cdot \Delta FC_2 + \Delta FC_w$$

$$D_1 = B_1 \cdot \Delta CM_1 + B_2 \cdot \Delta CM_2$$

$$D_2 = B_1 \cdot \Delta FC_1 + B_2 \cdot \Delta FC_2$$

Here, an evaluation quantity $\epsilon = (\Delta CM^2 + \Delta FC^2)$ is introduced. Determining the value of W so that this evaluation quantity becomes minimum, then $$W = -(C_1 \cdot D_1 + C_2 \cdot D_2)/(C_1^2 + C_2^2) \quad \ldots (7)$$

By substituting this value of W into equations (5-1) and (5-2), the values of $S_1$ and $S_2$ are determined. These values $S_1$, $S_2$ and W are in a combination effective to change the projection magnification by $\Delta\beta$, to change the distortion aberration by $\Delta SD$ and to minimize the square sum of a change in separate aberration. In other words, by using this correction method, the projection magnification and the distortion aberration can be corrected by desired amounts while, an the other hand, changes in two or more aberrations caused by the correction can be suppressed to a minimum.

When the number of aberrations to be minimized is three or more, an equation definition of them can be done in accordance with a similar concept as described above. The change in focus position of the projection optical system as those factors are changed can he compensated for by moving the Z stage, carrying and holding the wafer, in the optical axis direction. This is the same as in the first method of adjustment.

Use of the second method of adjustment described above effectively suppresses changes in other aberrations when the projection magnification error and the distortion aberration are corrected. Therefore, while retaining certain amounts of correction for the projection magnification and distortion aberration, decreases of tolerance for other aberration changes, such as coma, required by miniaturization of a circuit can be fully met. Also, a significant advantage is obtainable with respect to design of a projection optical system.

When this correction method is used, a higher effect is attainable if a combination of optical elements having a close ratio between the quantity of changes in aberrations to be minimized, that is, a close value of $\Delta CM_1/\Delta FC_i$ (i=1, 2, w), is selected. Alternatively, a particular note should be paid so that they come close to values set in the design of the projection optical system.

FIG. 2 is a lens sectional view of the projection optical system 5 according to this embodiment of the present invention. In this embodiment, the projection optical system is aberration corrected with respect to exposure light of a wavelength 248 nm which corresponds to the emission wavelength of a KrF excimer laser.

In FIG. 2, denoted at R is a reticle having an electronic circuit pattern formed thereon. The reticle R is placed on an object plane of the projection optical system. Denoted at $G_1$–$C_{16}$ are lenses which constitute the projection optical system.

Denoted at W is a wafer which is placed upon the best image plane of the projection optical system. Denoted at $S_1$ is the distance from the reticle R to the first lens surface of the projection optical system, and denoted at $S_k$ is the distance from the last lens surface of the projection optical system to the wafer W.

Table 1 shows the numerical data of the projection optical system of this embodiment. In this numerical data, $R_i$ is the curvature radius (mm) of the (i)th lens surface in the order from the object side, $D_i$ is the spacing (mm) between the (i)th lens surface and the (i)th lens surface in the order from the object side, $N_i$ is the refractive index of the medium between the (i)th lens surface and the (i+1)th lens surface in the order from the object side.

Table 2 shows the quantities of variations in aberrations when, in the projection optical system having the lens data of Table 1, the lens groups $G_1$ and $G_2$ are moved individually in the optical axis direction by 50 microns and also the wavelength is shifted by +10 pm.

TABLE 1

NA: 0.48
LARGEST OBJECT HEIGHT: 60 mm
RETICLE TO 1ST SURFACE: 120 mm
EXPOSURE WAVELENGTH: 248 nm

|  | R | D | N |
|---|---|---|---|
| $G_1$ | 2036.785 | 17.48 | 1.50841 |
|  | −233.211 | 0.50 |  |
| $G_2$ | 273.081 | 19.22 | 1.50841 |
|  | −470.487 | 54.29 |  |
| $G_3$ | 153.797 | 22.01 | 1.50841 |
|  | 74.523 | 18.39 |  |
| $G_4$ | −164.712 | 28.28 | 1.50841 |
|  | −111.304 | 10.00 |  |
| $G_5$ | −89.910 | 8.00 | 1.50841 |
|  | 116.514 | 18.90 |  |
| $G_6$ | −69.845 | 8.00 | 1.50841 |
|  | 1182.011 | 46.87 |  |

TABLE 1-continued

NA: 0.48
LARGEST OBJECT HEIGHT: 60 mm
RETICLE TO 1ST SURFACE: 120 mm
EXPOSURE WAVELENGTH: 248 nm

|  | R | D | N |
|---|---|---|---|
| $G_7$ | −410.218 | 24.00 | 1.50841 |
|  | −137.953 | 0.50 |  |
| $G_8$ | 3547.161 | 25.97 | 1.50841 |
|  | −171.895 | 0.50 |  |
| $G_9$ | 371.704 | 25.13 | 1.50841 |
|  | −313.422 | 0.50 |  |
| $G_{10}$ | 249.898 | 13.97 | 1.50841 |
|  | 986.296 | 13.48 |  |
| $G_{11}$ | 173.146 | 49.31 | 1.50841 |
|  | 84.594 | 38.11 |  |
| $G_{12}$ | −117.818 | 60.00 | 1.50841 |
|  | −209.089 | 47.32 |  |
| $G_{13}$ | −77.303 | 25.32 | 1.50841 |
|  | −92.395 | 0.50 |  |
| $G_{14}$ | 502.276 | 14.36 | 1.50841 |
|  | −326.430 | 0.50 |  |
| $G_{15}$ | 207.310 | 14.25 | 1.50841 |
|  | −8569.419 | 0.50 |  |
| $G_{16}$ | 107.980 | 53.66 | 1.50841 |
|  | 271.616 | 46.83 |  |
| $G_{17}$ | 56.290 | 18.35 | 1.50841 |
|  | 78.166 | 15.00 |  |

TABLE 2

|  | Δβ | ΔSD | ΔSA | ΔCM | ΔFC |
|---|---|---|---|---|---|
| MOVE $G_1$ + 50 μm | 90.4 | −65.7 | −0.029 | −0.006 | −0.003 |
| MOVE $G_2$ + 50 μm | −12.7 | 74.9 | 0.022 | −0.022 | 0.083 |
| SHIFT WAVELENGTH + 10 pm | −4.7 | −20.2 | 0.044 | −0.032 | 0.014 |

Δβ change (ppm) of projection magnification
ΔSD quantity (nm) of change in image deviation at the most abaxial, due to a change in symetric distortion aberration
ΔSA quantity (λ) of change of "value at pupil edge of wavefront aberration on the axis"
ΔCM quantity (λ) of change of "the half of the difference between values at opposite edges of the pupil in meridian direction of wavefront abberation at the most abaxial"
ΔFC quantity (μm) of chanqe of "best focus at the most abaxial, in meridian direction".

In conjunction with the data of Table 2, a conventional system (conventional method) for correcting a projection magnification error and a distortion aberration on the basis of driving two lens groups, will first be considered.

In accordance with calculations made on the basis of the data of Table 2, when the projection magnification is to be corrected by 50 ppm and the distortion aberration is to be corrected by 100 nm, the correction of the projection magnification and distortion aberration can be done if two lens groups are moved respectively by:

$G_1$:42.2 microns $G_2$:103.7 microns

The quantity of changes of the other aberrations are as follows:

Change of Spherical Aberration: 0.021 λ

Change of Comma Aberration: −0.050 λ

Change of Image Field Curvature: 0.170 micron

Thus, it is seen that particularly the coma and the image field curvature change largely.

The two methods described hereinbefore are applied to the present optical system.

FIRST METHOD

The projection magnification and distortion aberration are corrected and, also, the change in coma aberration is reduced to zero.

In accordance with calculations made on the basis of the data of Table 2, when the projection magnification is to be corrected by 50 ppm and the distortion aberration is to be corrected by 100 nm, the correction of the projection magnification and distortion aberration can be done when two lens groups are moved respectively by the following amounts and, also, the emission wavelength is shifted as follows:

$G_1$: 35.9 microns $G_2$: 81.4 microns

W: 31 12.4 pm

Simultaneously, with this adjustment, the change of coma aberration can be suppressed to zero.

The quantity of changes of the other aberrations are as follows:

Change of Spherical Aberration: $-0.040 \lambda$

Change of Image Field Curvature: 0.116 micron

Thus, the coma aberration change of $-0.05\lambda$ caused in the conventional method described above can be removed completely in this embodiment. This embodiment therefore provides can improvement effect of suppressing, to zero, at least one of aberrations remaining after correction of the projection magnification error and the distortion aberration.

While the coma aberration change is corrected to zero in the above-described example, as a matter of course, the coma aberration change can be corrected to any desired value.

Also, while the description has been made with reference to the coma aberration change, correction of spherical aberration or curvature of image field can be done in a similar manner.

As regards changes of aberrations other than the subject of correction to be caused by changing the wavelength as well as changes of aberrations other than the subject of correction to be caused by moving the lens groups, naturally they should be kept small. Generally, therefore, such lens groups may be selected and used in the correction system. Alternatively, in design of the projection optical system, the correction groups are optimized so that changes of aberrations other than the subject of correction are minimized.

If the driving stroke becomes large, inconveniences with respect to machine control may become large. Therefore, the correction system should be structured while taking into account the effect of drives of individual lens groups upon $\Delta\beta$, $\Delta SD$ and $\Delta CM$. Specifically, vectors ($\Delta\beta_1$, $\Delta SD_1$, $\Delta\beta CM_1$), ($\Delta\beta_2$, $\Delta SD_2$, $\Delta CM_2$) and ($\Delta\beta_w$, $\Delta SD_w$, $\Delta CM_w$) having components of the amounts in Table 3, as the (i)th group (where i is a natural number) is driven and the emission wavelength is changed, may be considered, and optimization may preferably be done, in designing, so that the angles defined by these vectors are sufficiently larger than zero deg., preferably, not less than 30 deg. and not greater than 150 deg.

TABLE 3

| | |
|---|---|
| Change of Projection Magnification: | $\Delta\beta_i$, $\Delta\beta_w$ |
| Change of Distortian Aberration: | $\Delta SD_i$, $\Delta SD_w$ |
| Change of Coma Aberration: | $\Delta CM_i$, $\Delta CM_w$ |

Also, such group may preferably be selected and used in the correcting system. Particularly, the angles defined by these three vectors at the largest image height are preferably not less than 30 deg. and not greater than 150 deg. While the description has been made with reference to correction of three elements $\Delta\beta$, $\Delta SD$, and $\Delta CM$, the concept described above can be applied to correction of any three optical performances.

The vector components are magnification, distortion and coma, for example, and there are inconveniences such as varieties in unit, or too large of differences in order of numerals, for example. It is therefore desirable to standardize there vector components with respect to a largest adjustment amount (largest amount of change in the component) which can be adjusted by the correction system.

In the present embodiment, when components constituting the vector are denoted by $\Delta\beta$, $\Delta SD$ and $\Delta CM$, three vectors ($\Delta\beta$, $\Delta SD$, $\Delta CM$) can be expressed as follows (see Table 2):

$G_1$ Vector: (90.4, $-65.7$, $-0.006$)

$G_2$ Vector: ($-12.7$, 74.9, $-0.022$)

Wavelength Vector: ($-4.7$, $-20.2$, $-0.032$)

There are too large of differences in digit (figure) of the components above, and these three vectors cannot be placed in space properly. In consideration of it, the component $\Delta\beta$ may be standardized with respect to 50 (ppm) and, similarly, the components $\Delta SD$ and $\Delta CM$ may be standardized with respect to 150 (nm) and 0.1 ($\lambda$), respectively. These numerical values correspond to the largest adjustment amounts to be adjusted by the correction system, and they are determined by the specification of the exposure apparatus, for example. The vectors thus standardized are:

$G_1$ Vector: (1.808, $-0.438$, $-0.060$)

$G_2$ Vector: ($-0.254$, 0.499, $-0.220$)

Wavelength Vector: ($-0.094$, $-0.135$, $-0.320$)

The angles to be defined by these vectors are:

The angle defined by $G_1$ Vector and $G_2$ Vector: 126.4 deg.

The angle defined by $G_2$ Vector and Wavelength Vector: 82.8 deg.

The angle defined by Wavelength Vector and $G_1$ Vector: 97.9 deg.

Here, these angles can be calculated in accordance with the following equation:

When two vectors $V_1$ and $V_2$ are $V_1 = (x_1, y_2, z_1)$ and $V_2 = (x_2, y_2, z_2)$, $\cos\theta = [x_1{}^*x_2 + y_1{}^*y_2 + z_1{}^*z_2]/[\sqrt{x_1{}^2+y_1{}^2+z_1{}^2}*\sqrt{x_2{}^2+y_2{}^2+z_2{}^2}]$

SECOND METHOD

The projection magnification and distortion error are corrected while, on the other hand, coma aberration change and image field curvature change are made minimum.

Calculations are made in accordance with the data of Table 2 and equations (5)–(7) and (4). Here, as an evaluation quantity to be minimized, $\epsilon' = \{(0.33*\Delta CM)^2 + (0.2*\Delta FC)^2\}$ is used. It differs from the above-described ε in that coefficients are applied before ΔCM and ΔFC, and they are weight coefficients for performing the minimization while taking balance of the coma aberration and the image field curvature.

In accordance with the calculations, when the projection magnification is to be corrected by 50 ppm and the distortion aberration is to be corrected by 100 nm, the correction of the projection magnification and distortion error can be done when two lens groups $G_1$ and $G_2$ are moved respectively by the following amounts and, also, the emission wavelength is shifted as follows:

$G_2$: 31.9 microns $G_2$: 67.4 microns

W: −20.2 pm

Simultaneously, with this adjustment, the change of coma aberration as well as the change of image field curvature can be minimized. The coma aberration and the image field curvature change by:

Change of Coma Aberration: 0.032 λ

Change of Image Field Curvature: 0.082 micron

Also, the spherical aberration change is as follows:

Change of Spherical Aberration: −0.078 λ

Although there is no remarkable effect of completely removing the change of coma aberration as in the first method described above, as compared with the conventional method, both of the coma aberration change and the image field curvature change are reduced. Thus, even by correction of the projection magnification error and the distortion aberration, a good imaging performance can be retained.

In this case, changes in optical performances other than the projection magnification and distortion aberration as the two lens groups are moved along the optical axis direction should preferably be made small, such that the projection magnification and the distortion aberration are corrected mainly by the movement of two lens groups while a change in any other optical performance caused thereby is minimized by changing the exposure wavelength.

Here, it is now assumed that $\Delta\beta_1$ is the amount of change of the largest image height due to the change in projection magnification and $\Delta SD_1$ is the amount of change of the largest image height due to a change in symmetric distortion aberration, both to be produced in response to movement of the first lens group $G_1$, and also that $\Delta\beta_2$ is the amount of change of the largest image height due to the change in projection magnification and $\Delta SD_2$ is the amount of change of the largest image height due to a change in symmetric distortion aberration, both to be produced in response to movement of the second lens group. In this embodiment, the projection optical system is so structured that an angle θ that can be expressed as follows is defined to be not less than 30 deg. and not greater than 150 deg.

$$\cos\theta = [\Delta\beta_1 * \Delta\beta_2 + \Delta SD_1 * \Delta SD_2]/[\sqrt{\Delta\beta_1^{2+\Delta SD_1^2}} * \sqrt{\Delta\beta_2^{2+\Delta SD_2^2}}]$$

With this arrangement, the mechanical precision of the movable lens groups as well as their driving strokes can be optimized.

This embodiment uses a projection optical system made of a single glass material and to be used with a KrF excimer laser as an exposure light source (wavelength 248 nm). However, similar correction can be done with the use of a projection lens made of different glass materials. Of course, the exposure light source is not limited to a KrF excimer laser, and the present invention is applicable also to a projection exposure apparatus having an exposure light source of an ArF excimer laser (wavelength 193 nm), an $F_2$ laser (wavelength 157 nm) or an ultra-high pressure Hg lamp (i-line of wavelength 365 nm).

In the correcting methods according to the embodiments of the present invention as described hereinbefore, various types of detecting can be used to obtain the projection magnification error, the distortion error, and changes of coma aberration or image field curvature. Specific examples are as follows:

(a) The surrounding pressure may be measured and, on the basis of a change from a reference state of the pressure, the projection magnification error and the distortion error (aberration) as well as the quantities of changes of the coma aberration and the curvature of image field, for example, may be calculated.

(b) The temperature of the projection optical system may be measured and, on the basis of a change from a reference state of the temperature, the projection magnification error and the distortion error (aberration) as well as the quantities of changes of the coma aberration and the curvature of image field, for example, may be calculated.

(c) The state of exposure/non-exposure may be monitored at a predetermined time interval and, on the basis of the information obtained therefrom, the projection magnification error and the distortion error (aberration) as well as the quantities of changes of the coma aberration and the curvature of image field, for example, may be calculated.

(d) A pattern of a reticle may be printed on a wafer through the projection optical system, and a resist pattern thus produced may be measured. On the basis of it, the projection magnification error and the distortion error (aberration) as well as the coma aberration and the curvature of image field, for example, may be measured.

(e) An aerial image produced by the projection optical system from the pattern of the reticle may be observed and, on the basis of it, the projection magnification error and the distortion error (aberration) as well as the the coma aberration and the curvature of image field, for example, may be measured.

(f) A wavefront aberration of the projection optical system may be measured by using an interferometer, for example, and on the basis of it, the projection magnification error and the distortion error (aberration) as well as the coma aberration and the curvature of image field, for example, may be measured.

Without use of such detecting/measuring means, a correction information table may be stored in a memory of an exposure apparatus, such that the correction may be made on the basis of the correction information. This will be particularly effective in the following case.

Optimum values concerning projection magnifications, distortion aberrations, coma aberrations, and image field curvatures, for example, corresponding to respective illumination modes, may be stored in an exposure apparatus in the form of a table. When the illumination mode is changed by another, correction of these elements may be done in accordance with the information of the table.

Next, an embodiment of a semiconductor device manufacturing method which uses a projection exposure apparatus according to any one of the preceding embodiments, will be explained.

Figure 3:
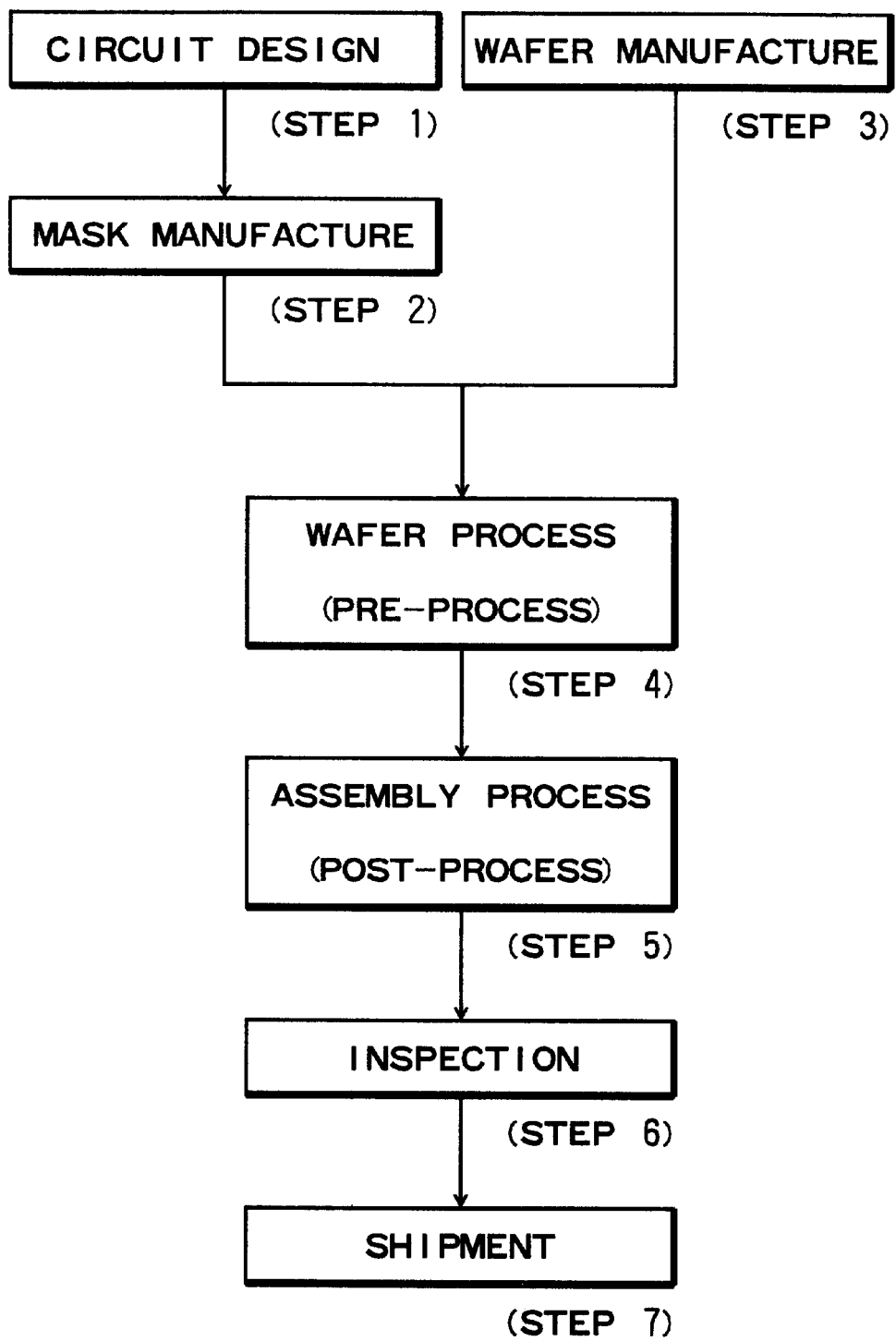
FIG. 3 is a flow chart of device manufacturing processes according to an embodiment of the present invention.

FIG. 3 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 4:
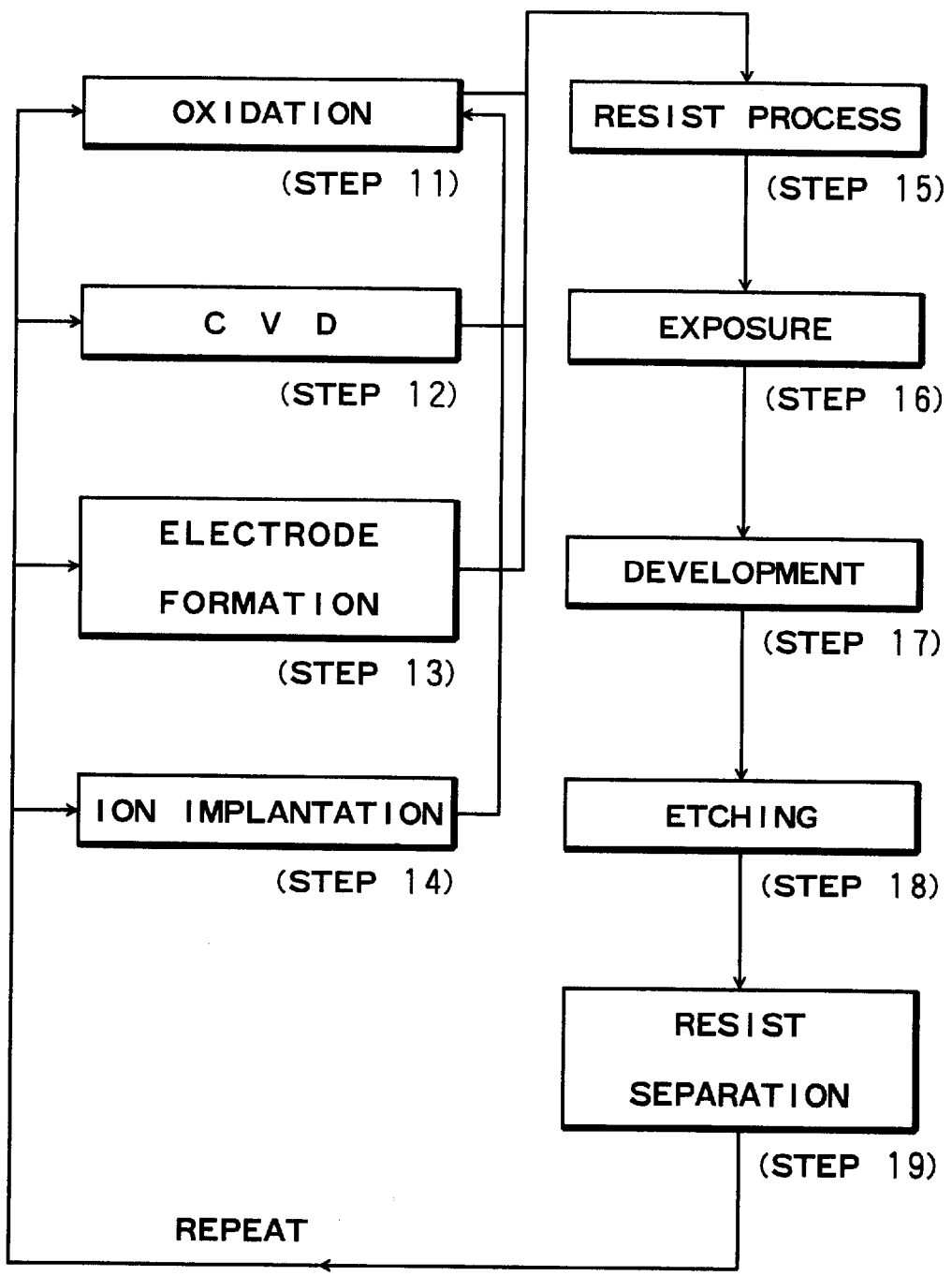
FIG. 4 is a flow chart of a wafer process in the procedure of FIG. 3.
Figure 7:
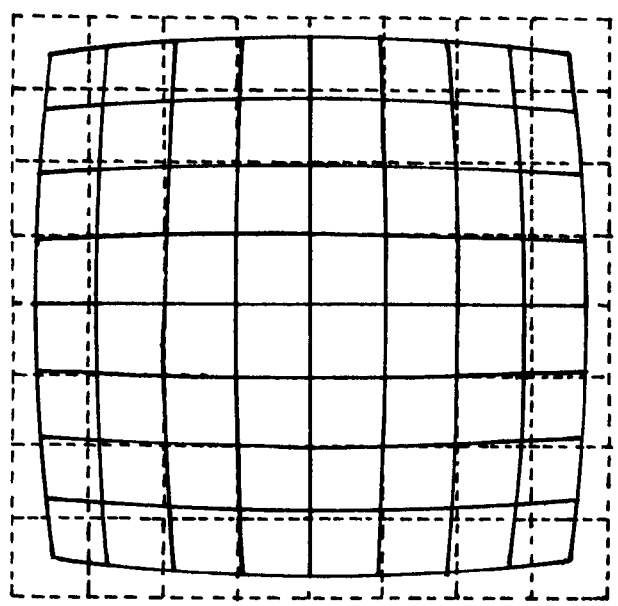
FIG. 7 is a schematic view for explaining another example of a projected pattern, resulting from a projection optical system with a symmetric distortion aberration.

FIG. 4 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus having a function for adjusting a projection magnification, a symmetric distortion aberration and an optical characteristic different from the projection magnification and the symmetric distortion magnification of a projection optical system, said apparatus comprising:

first changing means for changing a first optical parameter of the projection optical system;

second changing means for changing a second optical parameter of the projection optical system; and third changing means for changing a third optical parameter of the projection optical system, wherein a change in the projection magnification, a change in the symmetric distortion aberration and a change in the optical characteristic, all to be produced when the first optical parameter is changed, are $\Delta\beta_1$, $\Delta SD_1$ and $\Delta A_1$, respectively, wherein a change in the projection magnification, a change in the symmetric distortion aberration and a change in the optical characteristic, all to be produced when the second optical parameter is changed, are $\Delta\beta_2$, $\Delta SD_2$ and $\Delta A_2$, respectively, wherein a change in the projection magnification, a change in the symmetric distortion aberration and a change in the optical characteristic, all to be produced when the third optical parameter is changed, are $\Delta\beta_3$, $\Delta SD_3$ and $\Delta A_3$, respectively, wherein angles each defined by two of three vectors ($\Delta\beta_1$, $\Delta SD_1$ and $\Delta A_1$), ($\Delta\beta_2$, $\Delta SD_2$ and $\Delta A_2$) and ($\Delta\beta_3$, $\Delta SD_3$ and $\Delta A_3$) are not less than 30 deg. and not greater than 150 deg., and wherein the quantities of all the aforementioned changes correspond to those values each being provided by standardizing an amount of an actual change with respect to an amount of a largest change to be produced due to a corresponding one of said first to third changing means.

2. A projection exposure apparatus having a function for adjusting a projection magnification, a symmetric distortion aberration and an optical characteristic different from the projection magnification and the symmetric distortion magnification of a projection optical system, said apparatus comprising:

first changing means for changing a position of a first optical element of the projection optical system in a direction of an optical axis;

second changing means for changing a position of a second optical element of the projection optical system in a direction of an optical axis; and third changing means for changing a wavelength of exposure light to be incident on the projection optical system, wherein a change in the projection magnification, a change in the symmetric distortion aberration and a change in the optical characteristic, all to be produced when the position of the first optical element in the optical axis direction is changed, are $\Delta\beta_1$, $\Delta SD_1$ and $\Delta A_1$, respectively, wherein a change in the projection magnification, a change in the symmetric distortion aberration and a change in the optical characteristic, all to be produced when the second optical element in the optical axis direction is changed, are $\Delta\beta_2$, $\Delta SD_2$ and $\Delta A_2$, respectively, wherein a change in the projection magnification, a change in the symmetric distortion aberration and a change in the optical characteristic, all to be produced when the wavelength of the exposure light is changed, are $\Delta\beta_3$, $\Delta SD_3$ and $\Delta A_3$, respectively, wherein angles each defined by two of three vectors ($\Delta\beta_1$, $\Delta SD_1$ and $\Delta A_1$), ($\Delta\beta_2$, $\Delta SD_2$ and $\Delta A_2$) and ($\Delta\beta_3$, $\Delta SD_3$ and $\Delta A_3$) are not less than 30 deg. and not greater than 150 deg., and wherein the quantities of all the aforementioned changes correspond to those values each being provided by standardizing an amount of an actual change with respect to an amount of a largest change to be produced due to a corresponding one of said first to third changing means.

3. A projection exposure apparatus having a function for adjusting a projection magnification, a symmetric distortion aberration and a coma aberration of a projection optical system, said apparatus comprising:

first changing means for changing a first optical parameter of the projection optical system;

second changing means for changing a second optical parameter of the projection optical system; and third changing means for changing a third optical parameter of the projection optical system, wherein a change in the projection magnification, a change in the symmetric distortion aberration and a change in the coma aberration, all to be produced when the first optical parameter is changed, are $\Delta\beta_1$, $\Delta SD_1$ and $\Delta A_1$, respectively, wherein a change in the projection magnification, a change in the symmetric distortion aberration and a change in the coma aberration, all to be produced when the second optical parameter is changed, are $\Delta\beta_2$, $\Delta SD_2$ and $\Delta A_2$, respectively, wherein a change in the projection magnification, a change in the symmetric distortion aberration and a change in the coma aberration, all to be produced when the third optical parameter is changed, are $\Delta\beta_3$, $\Delta SD_3$ and $\Delta A_3$, respectively, wherein angles each defined by two of three vectors ($\Delta\beta_1$, $\Delta SD_1$ and $\Delta A_1$), ($\Delta\beta_2$, $\Delta SD_2$ and $\Delta A_2$) and ($\Delta\beta_3$, $\Delta SD_3$ and $\Delta A_3$) are not less than 30 deg. and not greater than 150 deg., and wherein the quantities of all the aforementioned changes correspond to those values each being provided by standardizing an amount of an actual change with respect to an amount of a largest change to be produced due to a corresponding one of said first to third changing means.

4. A projection exposure apparatus having a function for adjusting a projection magnification, a symmetric distortion aberration and a coma aberration of a projection optical system, said apparatus comprising:

first changing means for changing a position of a first lens of the projection optical system in a direction of an optical axis;

second changing means for changing a position of a second lens of the projection optical system in a direction of an optical axis; and third changing means for changing a wavelength of exposure light to be incident on the projection optical system, wherein a change in the projection magnification, a change in the symmetric distortion aberration and a change in the coma aberration, all to be produced when the position of the first lens in the optical axis direction is changed, are $\Delta\beta_1$, $\Delta SD_1$ and $\Delta A_1$, respectively, wherein a change in the projection magnification, a change in the symmetric distortion aberration and a change in the coma aberration, all to be produced when the position of the second lens in the optical axis direction is changed, are $\Delta\beta_2$, $\Delta SD_2$ and $\Delta A_2$, respectively, wherein a change in the projection magnification, a change in the symmetric distortion aberration and a change in the coma aberration, all to be produced when the wavelength of the exposure light is changed, are $\Delta\beta_3$, $\Delta SD_3$ and $\Delta A_3$, respectively, wherein angles each defined by two of three vectors ($\Delta\beta_1$, $\Delta SD_1$ and $\Delta A_1$), ($\Delta\beta_2$, $\Delta SD_2$ and $\Delta A_2$) and ($\Delta\beta_3$, $\Delta SD_3$ and $\Delta A_3$) are not less than 30 deg. and not greater than 150 deg., and wherein the quantities of all the aforementioned changes correspond to those values each being provided by standardizing an amount of an actual change with respect to an amount of a largest change to be produced due to a corresponding one of said first to third changing means.

5. A device manufacturing method, comprising the steps of:

printing a device pattern of a reticle onto a wafer by projection exposure with use of a projection exposure apparatus as recited in any one of claims 1–4; and developing the exposed wafer.

6. A method according to claim 5, wherein the projection optical system has optical elements constituted only by dioptric elements such as lenses.

7. A method according to claim 5, wherein the projection optical system has optical elements constituted by a dioptric element such as a lens and a catoptric element such as a mirror.

8. A method according to claim 5, wherein the wavelength of exposure light incident on the projection optical system is one of 365 nm, 248 nm, 193 nm, and 157 nm.

9. A method according to claim 8, further comprising using an excimer laser which produces ultraviolet rays of a wavelength of one of 248 nm, 193 nm and 157 nm.

10. A method according to claim 9, further comprising changing the wavelength of exposure light to a desired value in accordance with a change in shape of an effective light source of an illumination optical system.

11. A method according to claim 10, further comprising changing the projection magnification and the symmetric distortion aberration to desired values, respectively, in accordance with a change in shape of the effective light source of the illumination optical system.

* * * * *

UNITED STATES PATENT AND TRADEMARK OFFICE
CERTIFICATE OF CORRECTION

PATENT NO. : 6,256,086 B1
DATED : July 3, 2001
INVENTOR(S) : Yuhei Sumiyoshi

It is certified that error appears in the above-identified patent and that said Letters Patent is hereby corrected as shown below:

<u>Title page,</u>
Item [57], ABSTRACTS,
Line 4, "system is disclosed," should read -- system, --; and
Line 7, "reduced" should read -- reduced to be --.

<u>Column 1,</u>
Line 8, "suitable" should read -- suitably --;
Line 9, "step-and scan" should read -- step-and-scan --; and
Line 13, "such" should read -- such as --.

<u>Column 3,</u>
Line 6, "standardising" should read -- standardizing --;
Line 7, "a" should be deleted; and
Line 8, "to" should read -- to a --.

<u>Column 5,</u>
Line 61, "(2-4)" should read -- (2-1) --; and
Line 65, "$\Delta CM_1$" should read -- $\Delta CM_i$ --.

<u>Column 6,</u>
Line 44, "$\Delta CM+$" should read -- $\Delta CM=$ --.

<u>Column 7,</u>
Line 14, "$\Delta CM+0$" should read -- $\Delta CM=O$ --;
Line 64, "made" should read -- mode --; and
Line 67, "a" should read -- an --.

<u>Column 8,</u>
Line 33, "$\Delta CM \times C_1 \cdot W + D_1$" should read -- $\Delta CM = C_1 \cdot W + D_1$ --;
Line 34, "$\Delta FC \times C_2 \cdot W + D_2$" should read -- $\Delta FC = C_2 \cdot W + D_2$ --;
Line 58, "an" should read -- on --;
Line 64, " those" should read -- these --; and
"he" should read --be--.

UNITED STATES PATENT AND TRADEMARK OFFICE
CERTIFICATE OF CORRECTION

PATENT NO.     : 6,256,086 B1
DATED          : July 3, 2001
INVENTOR(S)    : Yuhei Sumiyoshi It is certified that error appears in the above-identified patent and that said Letters Patent is hereby corrected as shown below:

Column 9,
Line 14, "$\Delta CM_1/\Delta FC_i$" should read -- $\Delta CM_i/\Delta FC_i$ --;
Line 27, "$G_i\text{-}C_{16}$" should read -- $G_1\text{-}G_{16}$ --; and
Line 39, "(i)th" should read -- (i+1)th --.

Column 10,
Line 37, "$\Delta\beta$" should read -- $\Delta\beta$: --;
Line 38, "$\Delta SD$" should read -- $\Delta SD$: --;
Line 39, "symetric" should read -- symmetric --;
Line 40, "$\Delta SA$" should read -- $\Delta SA$: --;
Line 42, "$\Delta CM$" should read -- $\Delta CM$: --;
Line 44, "$\Delta FC$" should read -- $\Delta FC$: -- and
Line 61, "Comma" should read -- Coma --.

Column 11,
Line 20, "W:31 12.4pm" should read -- W:-12.4pm --;
Line 31, "-0.05λcaused" should read -- -0.05λ caused --;
Line 34, "can" should read -- an --; and
Line 60, " $\Delta\beta CM_1$)," should read -- $\Delta CM_1$), --.

Column 12,
Line 19, "there" should read -- the --; and
Line 59, "$\sqrt{x_2^2+y_2^2+z_2^2}]$" should read -- $\sqrt{x_2^2+y_2^2+z_2^2}]$ --.

Column 13,
Line 13, "$G_2$:" should read -- $G_1$: --; and
Line 56, "$[\sqrt{\Delta\beta_1^2+\Delta SD_1^2} * \sqrt{\Delta\beta_2^2+\Delta SD_2^2}]$" should read -- $[\sqrt{\Delta\beta_1^2+\Delta SD_1^2} * \sqrt{\Delta\beta_2^2+\Delta SD_2^2}]$ --.

UNITED STATES PATENT AND TRADEMARK OFFICE
CERTIFICATE OF CORRECTION

PATENT NO.   : 6,256,086 B1
DATED        : July 3, 2001
INVENTOR(S)  : Yuhei Sumiyoshi It is certified that error appears in the above-identified patent and that said Letters Patent is hereby corrected as shown below:

<u>Column 14,</u>
Line 41, "the" (first occurrence) should be deleted.

Signed and Sealed this

Eleventh Day of June, 2002

Attest:

Attesting Officer

JAMES E. ROGAN
*Director of the United States Patent and Trademark Office*